United States Patent [19]

Runge

[11] 4,319,119

[45] Mar. 9, 1982

[54] PROCESS FOR GETTERING SEMICONDUCTOR COMPONENTS AND INTEGRATED SEMICONDUCTOR CIRCUITS

[75] Inventor: Hartmut Runge, Kirchseeon, Fed. Rep. of Germany

[73] Assignee: Siemens Aktiengesellschaft, Berlin & Munich, Fed. Rep. of Germany

[21] Appl. No.: 52,075

[22] Filed: Jun. 25, 1979

[30] Foreign Application Priority Data

Jul. 7, 1978 [DE] Fed. Rep. of Germany ....... 2829983

[51] Int. Cl.³ .............................................. B23K 27/00
[52] U.S. Cl. ............................ 219/121 LM; 148/1.5; 219/121 LF
[58] Field of Search ...... 219/121 L, 121 LH, 121 LJ, 219/121 LE, 121 LF, 121 LM, 121 EM; 148/1.5; 357/91; 29/584

[56] References Cited

U.S. PATENT DOCUMENTS

| | | | |
|---|---|---|---|
| 3,556,879 | 1/1971 | Mayer | 148/187 X |
| 4,149,905 | 4/1979 | Levinstein et al. | 148/1.5 |
| 4,159,917 | 7/1979 | Gluck | 148/1.5 |

*Primary Examiner*—C. L. Albritton
*Attorney, Agent, or Firm*—Hill, Van Santen, Steadman, Chiara & Simpson

[57] ABSTRACT

Semiconductor components and integrated semiconductor circuits which are produced in a semiconductor crystal wafer are provided with a getter layer on the back side (opposite the active device side) of a semiconductor crystal wafer by controllably irradiating such back side with laser light pulses.

7 Claims, No Drawings

PROCESS FOR GETTERING SEMICONDUCTOR COMPONENTS AND INTEGRATED SEMICONDUCTOR CIRCUITS

BACKGROUND OF THE INVENTION

1. Field of the Invention

The invention relates to a process of producing semiconductor components and integrated semiconductor circuits and somewhat more particularly to a process for gettering semiconductor components and integrated semiconductor circuits whose structures are produced in monocrystalline semiconductor material wafers.

2. Prior Art

Novel semiconductor components and/or integrated semiconductor circuit devices as presently used in electronics impose extreme requirements on reverse and leakage currents associated with such devices as well as on the minority life-times of such devices. In order to meet these requirements, so-called gettering steps are undertaken during the production of such semiconductor devices to extract impurities, for example, heavy metals, from the active areas of the devices and deposit them in other less critical areas.

Generally, gettering areas consisting of extensive dislocation networks are arranged on a surface (back side) of a semiconductor crystal wafer which is averted or opposite from the wafer surface which contains the active components. For example, J. electrochem. Soc.: Solid-State Science and Technology, Vol. 122, pages 1725-1729 (1975) suggests covering the rear sides of semiconductor crystal wafers with a phosphorous dopant layer so as to produce a dislocation network at such rear sides. Another prior art process is described in German Offenlegungsschrift 27 14 413 wherein a gettering layer in the form of a polycrystalline or amorphous semiconductor layer is produced on the rear side of monocrystalline semiconductor wafers.

It is apparent that the best effect of a getter layer would be achieved if the getter layer could be regenerated before each critical process step, i.e., high temperature processes, ion-implantation processes, etc. However, this is not possible with current semiconductor technology for commercial reasons and because of the controlled run-through of the individual masking and separation processes typically required to re-generate a layer on a semicondcutor wafer.

SUMMARY OF THE INVENTION

The invention provides an improved gettering process for use with semiconductor components and integrated semiconductor circuits which are produced on a semiconductor crystal wafer and which is relatively simple in comparison with prior art processes and achieves an optimum gettering effect.

In accordance with the principles of the invention, the back side of a monocrystalline semiconductor material wafer, such as a silicon monocrystalline wafer, is controllably irradiated with laser light pulses so as to produce a dislocation network thereon. In certain preferred forms of the invention, the laser irradiation is adjusted in such a manner that a layer of material having a thickness in the range of about 0.5 to 10 $\mu$m is evaporated from the back side of the wafer by means of a first laser pulse and thereafter a second laser pulse is irradiated to produce the required dislocation network in the evaporated area. In preferred forms of the invention, the laser irradiation occurs before each process step for the semiconductor component and/or integrated semiconductor circuit which produces impurities to be gettered.

In instances where the invention is practiced with a silicon wafer, a ruby laser is utilized to produce the laser irradiation. In preferred embodiments of the invention, the first laser pulse is controlled so as to have an energy level which is higher by a factor of about 2 than the second laser pulse which is used in producing the dislocation network. In an exemplary preferred embodiment of the invention, a laser beam having an energy density in a range of about 1 to 10 joule/cm$^2$ is utilized and the pulse duration of the beam is controlled so as to be in the range of about 10 to 50 ns.

DESCRIPTION OF THE PREFERRED EMBODIMENTS

The invention provides an improved gettering process which is relatively simple and achieves an optimum gettering effect for semiconductor components and integrated semiconductor circuits which are produced on a semiconductor crystal wafer. In accordance with the principles of the invention, gettering areas on the back side of a semiconductor crystal wafer are produced by laser light pulses.

The principles of the invention allow one to utilize controlled laser irradiation at each instance before a semiconductor device processing step which produces impurities to be gettered so that the irradiated crystal areas, which are serverely disturbed by the laser irradiation, function as getters during such processing step.

In a preferred embodiment of the invention, the laser irradiation is so-controlled that a first beam impulse is irradiated onto a wafer surface at an energy density sufficient to evaporate a relatively thin layer of material from the irradiated area and thereafter a second beam impulse is irradiated onto the same area at an energy density sufficient to generate a relatively thin layer of material having a dislocation network therein. One embodiment of the invention involves adjusting the laser radiation in such a manner that a layer having a thickness in the range of about 0.5 to 10 $\mu$m is evaporated on the back side of the wafer by means of a first laser impulse and subsequently, the dislocation network, which is required for the gettering process, is produced by means of a second laser impulse, the thickness of this dislocation network containing layer being in the range of about 0.5 to 10 $\mu$m and most preferrably being about 1 $\mu$m.

In an exemplary embodiment where silicon is used as the semiconductor material, a ruby laser (having a wave length of 0.7 $\mu$m) is preferrable utiilzed because of the advantageous band spacing. The laser energy density is preferrably set within the range of about 1 to 10 joule/cm$^2$. The duration of the irradiated pulse is adjusted to be in the range of about 10 to 50 ns.

In accordance with the principles of the invention, a first laser pulse is controlled so as to have sufficient energy for the evaporation process and is generally higher by a factor of about 2 than a second laser pulse which is utilized for producing the dislocation netwrok, which acts as a getter.

Because of the use of laser light pulses for irradiating the back side of the wafer, the process in accordance with the invention is extremely simple. A high throughput of wafers can be readily achieved with a single laser. Since no cleaning or photo techniques have to precede or follow the application of the dislocation networks via the laser light pulse, the process in accordance with the principles of the invention is extremely economical. Moreover, the process of the invention is advantageous in that even the largest part of the impurities captured during the gettering step are removed from the back side of the wafer by means of the first pulse (i.e., evaporated). Contrary to the known gettering processes, a saturation of a gettering layer with impurities and, even in the most unfavorable instance, the possibility of the gettering layer becoming a source of impurities which diffuse into the semiconductor crystal wafer, are completely avoided.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. In a process for gettering semiconductor components and integrated semiconductor circuits whose structures are produced in monocrystalline semiconductor material wafers wherein gettering areas are provided on a back side of such wafer, the improvement comprising:

controllably irradiating select areas of a back side of a monocrystalline semiconductor material wafer with laser light pulses so as to produce dislocation networks in the irradiated areas, said laser irradiation being controlled in such a manner that at least two laser pulses are irradiated onto said select areas of the wafer, a first laser pulse being of sufficient energy to evaporate a relatively thin layer of material from the irradiated areas and a second laser pulse being of sufficient energy to produce dislocation networks in the irradiated areas, said first laser pulse having an energy level which is higher by a factor of 2 than that of said second layer pulse.

2. In a process as defined in claim 1 wherein said first laser pulse has sufficient energy to evaporate a layer having a thickness in the range of about 0.5 to 10 $\mu$m.

3. In a process as defined in claim 1 wherein said second laser pulse has sufficient energy to produce a getter layer having a thickness of about 0.5 to 10 $\mu$m.

4. A process as defined in claim 3 wherein said second laser pulse has sufficient energy to produce a getter layer having a thickness of about 1 $\mu$m.

5. A process as defined in claim 1 wherein said wafer is composed of silicon and said laser light pulses are generated from a ruby laser.

6. A process as defined in claim 1 wherein said laser light pulses have an energy density in the range of about 1 to 10 joule/cm$^2$ and said pulse have a duration of about 10 to 50 ns.

7. A process for producing a gettering layer on semiconductor components and on integrated semiconductor circuits whose structures are produced in monocrystalline semiconductor material wafers comprising:

controllably irradiating a back surface of such wafers with a first laser light pulse having sufficient energy to evaporate a relatively thin layer of material from said surface so as to produce a fresh surface; and controllably irradiating the fresh surface of such wafer with a second laser light pulse having sufficient energy to produce a relatively thin layer of dislocation network, said first laser light pulse having an energy density which is higher by a factor of about 2 than the energy density of said second laser light pulse.

* * * * *